US009356678B2

(12) United States Patent
Harris, III (10) Patent No.: US 9,356,678 B2
(45) Date of Patent: May 31, 2016

(54) DIVERSE RADIO RECEIVER SYSTEM (75) Inventor: Otis Robert Harris, III, Orlando, FL (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 234 days.

(21) Appl. No.: 13/978,884

(22) PCT Filed: Jan. 2, 2012

(86) PCT No.: PCT/IB2012/050010
§ 371 (c)(1),
(2), (4) Date: Jul. 10, 2013

(87) PCT Pub. No.: WO2012/095753
PCT Pub. Date: Jul. 19, 2012

(65) Prior Publication Data
US 2013/0295867 A1 Nov. 7, 2013

Related U.S. Application Data (60) Provisional application No. 61/432,610, filed on Jan. 14, 2011.

(51) Int. Cl.
*H04B 7/08* (2006.01)
*H04B 1/18* (2006.01)
*G01R 33/36* (2006.01)

(52) U.S. Cl.
CPC .......... *H04B 7/0814* (2013.01); *G01R 33/3664* (2013.01); *H04B 1/18* (2013.01); *G01R 33/3621* (2013.01)

(58) Field of Classification Search
CPC .... H04B 1/18; H04B 7/0814; H01R 33/3621; H01R 33/3664

USPC .............. 455/73, 78, 80, 83, 562.1, 101, 269, 455/277.1; 375/267, 347
See application file for complete search history.

(56) References Cited

U.S. PATENT DOCUMENTS

| 5,768,691 A | * | 6/1998 | Matero et al. ................... 455/78 |
| 5,815,804 A | | 9/1998 | Newell et al. |
| 6,115,585 A | | 9/2000 | Matero et al. |

(Continued)

FOREIGN PATENT DOCUMENTS

| EP | 1432133 A1 | 6/2004 |
| EP | 1608083 A1 | 12/2005 |

(Continued)

*Primary Examiner* — Thanh Le (57) ABSTRACT

A diverse radio receiver system includes a radio frequency (RF) circuit board, a plurality of RF receivers disposed on the RF circuit board, and switching circuitry disposed on the RF circuit board. The switching circuitry includes transmission lines and switches connecting each RF receiver with (1) a selected one antenna of a plurality of antennas and (2) an impedance matching circuit providing impedance matching of the selected one antenna with the RF receiver. The switching circuitry is configured to implement a plurality of selectable switch configurations, each switch configuration connecting each RF receiver of the plurality of RF receivers with a selected antenna of the plurality of antennas. The impedance matching circuits of the switching circuitry may comprise impedance matching transmission line stubs. The diverse radio receiver system may be configured to receive an RF signal transmitted by a wireless magnetic resonance (MR) receive coil.

17 Claims, 4 Drawing Sheets (56) References Cited

U.S. PATENT DOCUMENTS

| | | |
|---|---|---|
| 2003/0206019 A1 | 11/2003 | Boskamp |
| 2005/0245207 A1 | 11/2005 | Suzuki et al. |
| 2005/0272384 A1 | 12/2005 | Kogure |
| 2008/0159363 A1 | 7/2008 | Rofougaran |
| 2010/0003941 A1 | 1/2010 | Kojima |
| 2010/0225543 A1 | 9/2010 | Kakitsu et al. |

FOREIGN PATENT DOCUMENTS

| | | |
|---|---|---|
| WO | 2004015881 A1 | 2/2004 |
| WO | 2005017548 A1 | 2/2005 |
| WO | 2008155703 A1 | 12/2008 |
| WO | 2009157357 A1 | 12/2009 |

\* cited by examiner

DIVERSE RADIO RECEIVER SYSTEM

CROSS REFERENCE TO RELATED APPLICATIONS

This application is a national filing of PCT application Ser. No. PCT/IB2012/050010, filed Jan. 2, 2012, published as WO 2012/095753 A1 on Jul. 19, 2012, which claims the benefit of U.S. provisional application Ser. No. 61/432,610 filed Jan. 14, 2011, which is incorporated herein by refernce.

The following relates to the radio frequency (RF) arts, magnetic resonance imaging and spectroscopy arts, and related arts.

Magnetic resonance (MR) imaging is a known medical imaging technique, which is also employed in veterinary imaging and other imaging applications such as characterizing archaeological artifacts. An MR laboratory typically employs various radio frequency communication links and systems. By way of illustrative example, an MR laboratory may employ: wireless MR receive coils that communicate with the MR electronics via RF transmission; wireless electronic patient monitoring devices such as electrocardiograph (ECG or EKG) devices, respiration monitoring devices, or so forth; or wireless therapeutic devices such as an infusion pump for intravenous fluid delivery.

The MR laboratory environment presents substantial challenges for wireless RF communications. The MR system employs magnetic field gradient and RF excitation coils that produce substantial RF interference (RFI). Also, the MR laboratory is typically in an RF-shielded room which can amplify multipath propagation issues. RFI or multipath propagation can result in intervals of weak or undetectable signal strength for a given RF communication system. Such signal drops are undesirable in any RF communication system, and can be especially problematic when the RF communication system is conveying critical patient data.

The MR environment also favors smaller electronic systems. For example, wireless MR receive coils or patient monitoring devices are preferably compact, both for convenience and efficient usage of limited space, and because patients tend to be less intimidated by smaller apparatus. These considerations favor smaller RF receive systems, which however, can exasperate RFI and multipath propagation issues.

While the RF environment is particularly challenging for RF communications, more generally the disclosed diverse radio receiver systems are suitably used in any environment in which the potential for weak or lost RF signal drops is of concern. For example, the disclosed diverse RF receiver systems are suitably used in hospital environments generally, or in emergency communication systems, cellular telephone systems, or so forth.

The following provides new and improved apparatuses and methods as disclosed herein.

In accordance with one disclosed aspect, an apparatus comprises a diverse radio receiver system including: a radio frequency (RF) circuit board; a plurality of RF receivers disposed on the RF circuit board; and switching circuitry disposed on the RF circuit board, the switching circuitry including transmission lines and switches connecting each RF receiver with (1) a selected one antenna of a plurality of antennas and (2) an impedance matching circuit providing impedance matching of the selected one antenna with the RF receiver. In some embodiments the impedance matching circuits of the switching circuitry comprise impedance matching transmission line stubs.

In accordance with another disclosed aspect, an apparatus comprises a diverse radio receiver system including: a radio frequency (RF) circuit board; a plurality of RF receivers disposed on the RF circuit board; switching circuitry disposed on the RF circuit board; and a signal selector receiving signals from the plurality of RF receivers and outputting a selected one of the received signals. The switching circuitry includes transmission lines and switches connecting each RF receiver with (1) a selected one antenna of a plurality of antennas and (2) an impedance matching circuit providing impedance matching of the selected one antenna with the RF receiver. The switching circuitry is configured to implement a plurality of selectable switch configurations, each switch configuration connecting each RF receiver of the plurality of RF receivers with a selected antenna of the plurality of antennas.

In accordance with another disclosed aspect, an apparatus comprises a diverse radio receiver system including a plurality of radio frequency (RF) receivers disposed on an RF circuit board and switching circuitry including transmission lines connecting the RF receivers with antennas and switches for switching antenna/RF receiver connections to implement receiver spatial diversification. The switching circuitry further includes impedance matching circuits that are switched in conjunction with the switching of antenna/RF receiver connections to maintain impedance matching of antenna/RF receiver connections.

In accordance with another disclosed aspect, an apparatus as set forth in any one of the three immediately preceding paragraphs further includes a wireless MR receive coil configured to receive an MR signal and to transmit an RF signal corresponding to the received MR signal, wherein the diverse radio receiver system is configured to receive the RF signal transmitted by the wireless MR receive coil. In accordance with another disclosed aspect, an apparatus as set forth in any one of the three immediately preceding paragraphs further includes a magnetic resonance (MR) scanner and a wireless MR receive coil arranged to receive an MR signal excited in a subject by the MR scanner and to transmit an RF signal corresponding to the received MR signal, wherein the diverse radio receiver system is configured to receive the RF signal transmitted by the wireless MR receive coil. In accordance with another disclosed aspect, an apparatus as set forth in any one of the three immediately preceding paragraphs further includes an RF shielded room and a magnetic resonance (MR) scanner disposed in the RF shielded room, wherein the diverse radio receiver system is disposed in the RF shielded room and is configured to receive an RF signal transmitted by a wireless electronic device disposed in the RF shielded room.

One advantage resides in providing a diverse radio receiver system that is robust against radio frequency interference (RFI) and multipath propagation.

Another advantage resides in reduced manufacturing cost for a diverse radio receiver system.

Another advantage resides in reduced footprint area for a diverse radio receiver system layout.

Another advantage resides in a more compact radio communication device.

Further advantages will be apparent to those of ordinary skill in the art upon reading and understanding the following detailed description.

FIG. 2 shows the layout in a first switch configuration and FIG. 3 shows the layout in a second switch configuration.

Figure 1:
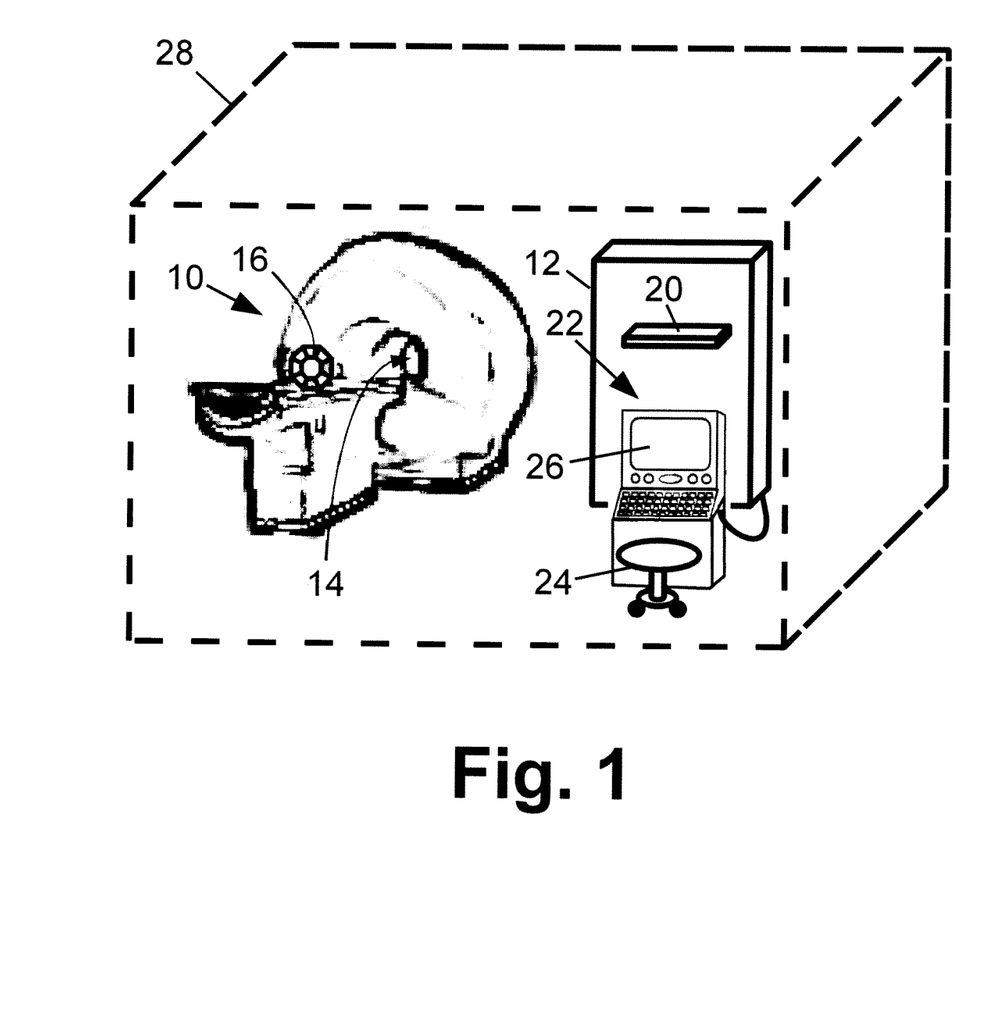
FIG. 1 diagrammatically shows a magnetic resonance (MR) system including a wireless MR receive coil and corresponding diverse radio receiver system.

With reference to FIG. 1, a magnetic resonance (MR) laboratory includes an MR scanner 10, such as an illustrated Achieva™ MR scanner (available from Koninklijke Philips Electronics N.V., Eindhoven, The Netherlands), or an Intera™ or Panorama™ MR scanner (both also available from Koninklijke Philips Electronics N.V.), or another commercially available MR scanner, or a non-commercial MR scanner, or so forth. In a typical embodiment, the MR scanner includes internal components (not illustrated) such as a superconducting or resistive main magnet generating a static ($B_0$) magnetic field, sets of magnetic field gradient coil windings for superimposing selected magnetic field gradients on the static magnetic field, and a radio frequency excitation system for generating a radio frequency ($B_1$) field at a frequency selected to excite magnetic resonance (typically $^1$H magnetic resonance, although excitation of another magnetic resonance nuclei or of multiple magnetic resonance nuclei is also contemplated).

MR system electronics 12 are diagrammatically indicated in FIG. 1. These electronics 12 drive or operate the MR scanner 10, or components thereof, to perform various operations such as executing a pulse sequence including applying magnetic field gradients and radio frequency excitation pulses designed to excite, localize, spatially encode, or otherwise create and manipulate magnetic resonance in a subject (not shown) disposed in a bore 14 or other examination region of the MR scanner 10. The magnetic resonance signals are detected by an MR receive coil 16, which in the illustrative embodiment is a wireless MR receive coil that includes internal components (not illustrated) such as analog-to-digital conversion circuitry and digital signal processing (DSP) circuitry configured to digitize the MR signal, shift the MR signal to an intermediate frequency and/or perform filtering and/or other optional pre-processing of the MR signal, and transmit a radio frequency (RF) signal corresponding to the received MR signal. Typically, the signal transmitted off the MR receive coil 16 is a digital signal comprising a carrier wave in the gigahertz range (e.g., 2.4 GHz in some embodiments) carrying the received and processed MR signal encoded onto the carrier wave by a suitable digital modulation technique such as amplitude shift keying (ASK), frequency shift keying (FSK), quadrature phase shift keying (QPSK), offset quadrature phase shift keying (OQPSK), or so forth. Alternatively, it is contemplated for the wireless MR receive coil 16 to operate entirely in analog mode and to transmit an RF signal comprising a carrier wave modulated by the received and processed MR signal modulated onto the carrier wave using a suitable analog modulation technique such as amplitude modulation (AM), frequency modulation (FM), or so forth.

At the electronics 12, a diverse radio receiver system 20 receives the signal transmitted by the wireless MR receive coil 16. The electronics 12 include further components (not shown), such as: an MR image reconstruction module or circuitry configured to reconstruct an MR image of the subject from suitably spatially encoded MR signals; electronic, magnetic, optical, or other storage devices for storing the acquired MR signals and/or reconstructed images; and so forth. In the illustrative MR laboratory, a computer 22 is employed to provide human interfacing with and control of the MR system 10, 12 (for example, with a radiologist or other human operator seated on an illustrative stool 24), and the computer 22 includes or is operatively connected with a display device 26 for displaying reconstructed MR images, MR spectra, or other MR data. Optionally, the computer 22 may also be programmed to provide MR system functionality such as embodying the image reconstruction module. The MR laboratory is suitably enclosed in an RF-shielded room 28 (indicated diagrammatically in FIG. 1).

FIG. 1 illustrates a suitable application of the diverse radio receiver system 20 disclosed herein in the context of an MR laboratory. It will be appreciated that the diverse radio receiver systems disclosed herein are suitably employed in conjunction with wireless MR receive coils in combination with substantially any type of MR scanner, such as the illustrative horizontal cylindrical bore-type MR scanner 10, or a vertical bore MR scanner, open bore MR scanner, or so forth. Such MR environments are challenging for RF communications, at least due to the close proximity of equipment 10, 12, 22 that generates radio frequency interference (RFI), and a propensity for multipath propagation in the RF-restricted space defined by the RF-shielded room 28. More generally, the disclosed diverse radio receiver systems will find application in radio systems and devices employing radio communications generally. To provide some additional illustrative applications, the diverse radio receiver systems disclosed herein are suitably used to receive wireless signals transmitted by patient monitoring devices (either inside the RF-shielded room 28 of an MR laboratory or elsewhere, such as in hospital patient rooms), or in cellular telephones to receive wireless signals from cellular towers, or so forth. The diverse radio receiver systems disclosed herein can advantageously be compactly constructed, for example manufactured on a single RF circuit board, and advantageously can provide a higher number of impedance-matched RF receive pathways than the number of RF receivers disposed on the circuit board, thus reducing cost.

Figure 2:
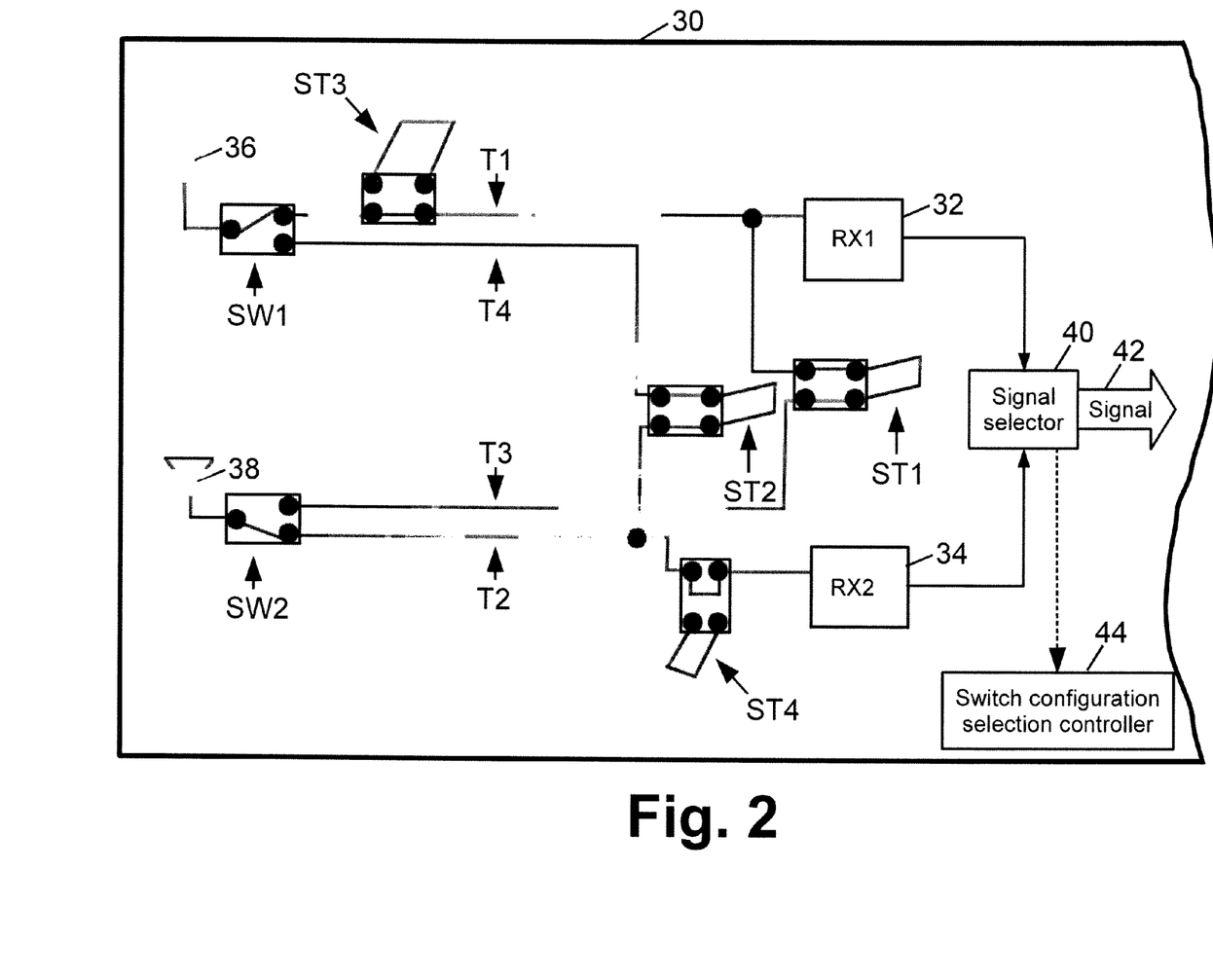
FIGS. 2 and 3 diagrammatically show the layout for the diverse radio receiver system of FIG. 1.
Figure 3:
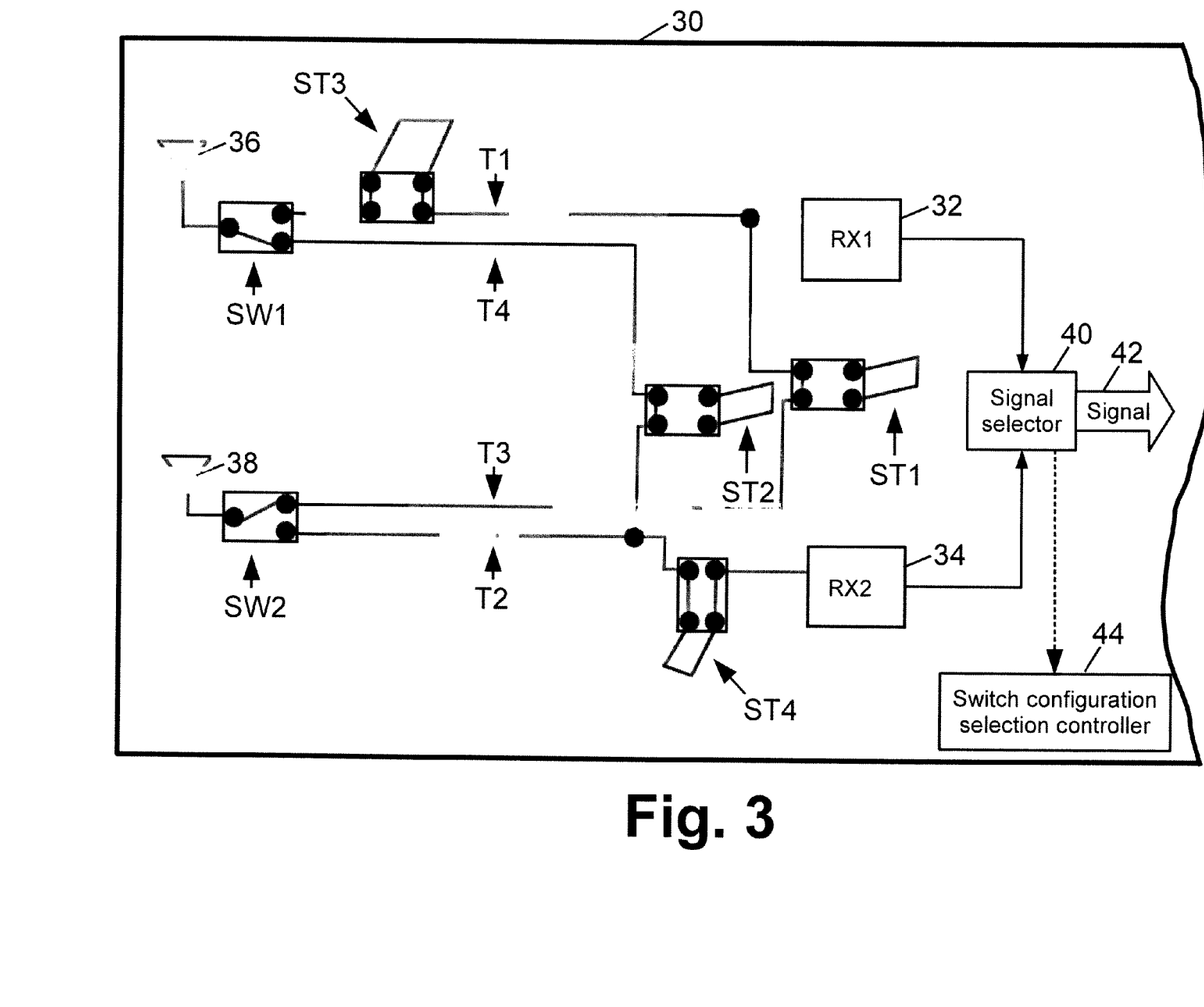

With reference to FIGS. 2 and 3, the illustrative diverse radio receiver system 20 is shown in layout form. The diverse radio receiver system 20 is disposed on a single RF circuit board 30, and includes two radio receivers 32, 34. The RF receiver 32 is also referred to herein as "RX1", while the RF receiver 34 is also referred to herein as "RX2". The diverse radio receiver system 20 is coupled with two antennae 36, 38 via switching circuitry including transmission lines T1, T2, T3, T4 and switches SW1, SW2. In this illustrative embodiment, the switching circuitry provides two switch configurations, which are as follows.

In the first switch configuration (shown in FIG. 2), the first RF receiver 32 (i.e., RX1) is connected with the first antenna 36 via transmission line T1 and the switch SW1, and the second RF receiver 34 (i.e., RX2) is connected with the second antenna 38 via transmission line T2 and the switch SW2.

In the second switch configuration (shown in FIG. 3), the first RF receiver 32 (i.e., RX1) is connected with the second antenna 38 via transmission line T3 and the switch SW2, and the second RF receiver 34 (i.e., RX2) is connected with the first antenna 36 via transmission line T4 and the switch SW1.

The diverse radio receiver system 20 of FIGS. 2 and 3 thus provides four possible signal reception pathways—two provided by the first switch configuration of FIG. 2, and two provided by the second switch configuration of FIG. 3. However, only two signal reception pathways are available at any given instant in time. A signal selector 40 receives signals from the two RF receivers 32, 34 and outputs a selected one of the received signals as an output signal 42. Typically, the output signal is selected by the signal selector 40 as the "stronger" of the two signals received from the RF receivers 32, 34, where signal strength is measured by a suitable metric, such as averager or integrated signal power.

In some embodiments it is contemplated for the signal selector 40 to be integrated with some post-acquisition processing. For example, it is contemplated to extract digital data from the signals output by the two receivers 32, 34 and to determine signal strength and make the signal selection based on digital data informational content determined from the extracted digital data. (Note that this approach assumes the diverse radio receiver system 20 is receiving a digital RF transmission; in an analog alternative, a metric such as a spectral content metric might be used).

If neither receiver 32, 34 provides an acceptable signal, then the signal selector 40 suitably triggers a switch configuration selection controller 44 that switches the two switches SW1, SW2 in order to switch from the current switch configuration (either the first switch configuration or the second switch configuration) to the other switch configuration. Alternatively, if the rate of incoming data rate (e.g., in bits/sec for binary data) is sufficiently slow as compared with the achievable switching rate for the switches SW1, SW2 of the diverse radio receiver system 20, then in an alternate embodiment the switch configuration selection controller 44 may operate "open loop", that is, switching between the first and second switch configurations at a constant switching rate substantially higher than the incoming data rate, so that the signal selector 40 effectively samples all four possible signal reception pathways and selects the strongest of the four received signals. In this alternative approach, the communication from the signal selector 40 to the switch configuration selection controller 44 indicated in FIGS. 2 and 3 may optionally be omitted.

The disclosed diverse radio receiver systems employ switching circuitry to provide more diverse signal reception pathways. While this is advantageous, it is recognized herein that the approach can introduce problematic impedance mismatches. This is because in any given switch configuration, transmission lines (or portions thereof) that are not connected with an antenna remain connected with the RF receiver. For example, consider the first switch configuration of FIG. 2. The first RF receiver 32 is connected with the first antenna 36 via the transmission line T1; but, the first RF receiver 32 is also connected with the transmission line T3 up to its open circuit termination at the switch SW2. Similarly, the second RF receiver 34 is connected with the second antenna 38 via the switch SW2; but, the second RF receiver 34 is also connected with the transmission line T4 up to its open circuit termination at the switch SW1. Similarly, consider the second switch configuration of FIG. 3. Here, the first RF receiver 32 is connected with the second antenna 38 via the transmission line T3; but, the first RF receiver 32 is also connected with the transmission line T1 up to its open circuit termination at the switch SW1. Similarly, the second RF receiver 34 is connected with the first antenna 36 via the switch SW1; but, the second RF receiver 34 is also connected with the transmission line T2 up to its open circuit termination at the switch SW2.

The impact of these connected "open" transmission lines is that they affect the input impedance seen by the RF receiver 32, 34. In RF circuits, transmission lines are traditionally constructed to have 50 ohm real impedance (with zero ohm reactance or imaginary component). (More generally, it is contemplated for the diverse radio receiver system 20 to employ non-standard transmission lines having impedance other than 50 ohm; but, even in this more general case the expectation is that the transmission line is matched to the RF receiver). The connected "open" transmission lines produce a different impedance as seen at the input to the RF receiver 32, 34. Such an impedance mismatch would substantially degrade RF signal transmission and hence performance of the diverse radio receiver system.

The diverse radio receiver system 20 includes impedance matching circuitry to compensate for the connected "open" transmission lines. In the illustrative embodiment, the impedance matching circuitry comprises four impedance matching stubs ST1, ST2, ST3, ST4. Impedance matching stubs ST1, ST2, ST3, ST4 are made from specific lengths of copper (or, more generally, an electrical conductor) disposed on the printed circuit board 30. The stubs, ST2, ST3, ST4 suitably have shorted loads (that is, the load $Z_L=0$), although it is also contemplated to employ a stub with an open load ($Z_L=\infty$), resistive load ($Z_L$ being a real value), or so forth. Moreover, while the illustrative diverse radio receiver system 20 employs impedance matching transmission line stubs ST1, ST2, ST3, ST4 as the impedance matching circuits, it is also contemplated to employ another impedance matching circuit such as an impedance matching LC network circuit.

The use of four stubs ST1, ST2, ST3, ST4 arises because there are four potential "open" transmission lines in the two switching configurations of FIGS. 2 and 3. In the first switching configuration of FIG. 2 the "open" transmission lines T3 and T4 are compensated by respective stubs ST1 and ST2. In the second switching configuration of FIG. 3 the "open" transmission lines T1 and T2 are compensated by respective stubs ST3 and ST4. The stubs ST1, ST2, ST3, ST4 include switches to enable each stub to be switched into the circuit only when its corresponding transmission line is "open", that is, not connected with an antenna. Thus, in the first switching configuration of FIG. 2 the stubs ST1, ST2 are switched into the circuit while the stubs ST3, ST4 are switched out (that is, isolated from the circuit). In the second switching configuration of FIG. 3 the stubs ST3, ST4 are switched into the circuit while the stubs ST1, ST2 are switched out (that is, isolated from the circuit). The switches of the stubs ST1, ST2, ST3, ST4 are operated together and in synch with the switches SW1, SW2 by the switch configuration selection controller 44 to implement the two respective switch configurations shown in respective FIGS. 2 and 3 including suitable compensation for "open" transmission lines by corresponding impedance matching stubs.

While the switch configuration selection controller 44 is shown in FIGS. 2 and 3 as a component disposed on the RF circuit board 30, in some embodiments the switch configuration selection controller 44 may be implemented a software module or component, for example a microprocessor or microcontroller that sends switch control signals. In such embodiments, the microprocessor or microcontroller implementing the switch configuration selection controller 44 may be located either on the RF circuit board 30 or off-board (e.g., on another printed circuit board component of the diverse radio receiver system, or as part of a computer operatively connecting with the diverse radio receiver system and running suitable control software, or so forth).

The impedance matching transmission line stubs ST1, ST2, ST3, ST4 can be made with copper of some known length that is etched onto the RF circuit board 30. This etching can be done at the same time, and in the same processing step, as that used to form the transmission lines T1, T2, T3, T4. The length of copper suitable for providing impedance matching is suitably determined by conventional RF circuit design techniques based on the layout (e.g., lengths) of the transmission lines T1, T2, T3, T4. For example, Smith chart analysis can be used to determine suitable lengths for the impedance matching stubs ST1, ST2, ST3, ST4. In a typical layout, the "open" transmission line intersects the transmission line connecting the RF receiver with an antenna. For example, in the first switch configuration of FIG. 2, the "open" transmission line T3 intersects the transmission line T1 that connects the first antenna 36 with the first RF receiver 32. The effect of this intersecting "open" transmission line T3 is to modify the impedance of the transmission line T1 as seen by the RF receiver 32. A Smith chart can be used to express the characteristic impedance (Z) that the intersecting transmission line T3 creates, and to interpret the change of (Z) when the two transmission lines T1, T3 are intersecting. The Smith chart can thus be used to determine the appropriate length copper for the corresponding impedance matching stub ST1 that compensates for the intersecting "open" transmission line T3, so as to ensure that an impedance (Z) of 50 ohms (assuming conventional 50 ohm transmission line design) will be seen by the input of the RF receiver 32 in the first switch configuration of FIG. 2. Similar design is performed for: the stub ST2 which compensates for the effect of intersecting transmission line T4 on the transmission line T2 connecting second antenna 38 and second RF receiver 34 in the first switch configuration of FIG. 2; the stub ST3 which compensates for the effect of intersecting transmission line T1 on the transmission line T3 connecting second antenna 38 and first RF receiver 32 in the second switch configuration of FIG. 3; and the stub ST4 which compensates for the effect of intersecting transmission line T2 on the transmission line T4 connecting first antenna 36 and second RF receiver 34 in the second switch configuration of FIG. 3.

If the impedance matching circuit is other than a stub, then the design entails choosing suitable discrete components (e.g., inductance L and capacitance C in the case of an LC impedance matching circuit) to provide the appropriate compensating impedance. Moreover, it should be noted that the location of the various impedance matching circuits ST1, ST2, ST3, ST4 along the corresponding transmission lines is flexible, although the selected location may impact the length of the stub (or, more generally, the appropriate compensating impedance value) suitable for compensating the "open" transmission line. By way of illustrative example, the stub ST4 is shown in FIGS. 2 and 3 located between the intersection of transmission lines T2, T4 and the second RF receiver 34; however, this stub could instead be located between the switch SW2 and the intersection of transmission lines T2, T4.

Although RF design using a Smith chart is described, it is also contemplated to additionally or alternatively employ RF design software to perform the RF analysis to design the stub lengths (or more generally compensating impedances) of the impedance matching circuits. One suitable RF design software program is QuickSmith (available at http://www.nathaniyer.com/qsdw.htm, last accessed Jan. 6, 2011).

The illustrative antennas 36, 38 are disposed on the RF circuit board 30. For example, the antennas 36, 38 may be embodied as copper traces, or as elements secured to the RF circuit board 30, or so forth. Alternatively, the antennas may be located "off-board", that is, not disposed on the RF circuit board 30, and be electrically connected with the respective switches SW1, SW2 via suitable wiring or cabling. In this latter case, any contribution of the off-board wiring or cabling to the impedance seen by the RF receiver should be taken into account in determining the impedance matching.

Figure 4:
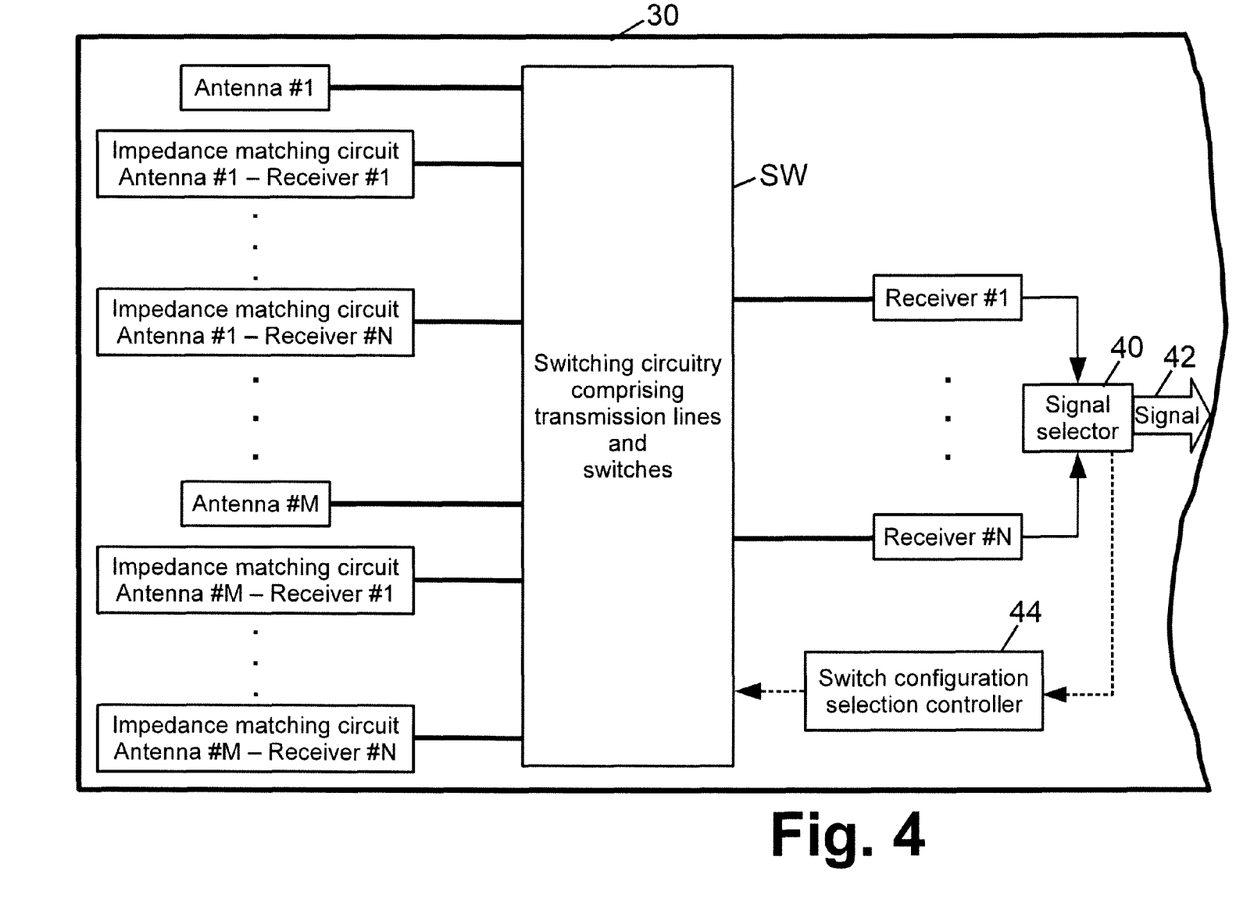
FIG. 4 diagrammatically shows a generalized layout for a diverse radio receiver system including N receivers and M available antennas.

With reference to FIG. 4, the disclosed diverse radio receiver systems employing antenna switching with impedance matching of "open" transmission lines in the various switch configurations can be generalized to any number of RF receivers and any number of available antennas. In the diagrammatic example of FIG. 4, the diverse radio receiver system is diagrammatically represented (without loss of generality) as having N RF receivers (where N is an integer greater than one) and M available antennas (where M is an integer greater than one). The example of FIGS. 2 and 3 corresponds to N=M=2. Note that N does not necessarily equal M, although typically M≥N is preferable (otherwise at least one RF receiver will not be connected with any antenna in each switch configuration). In general, any antenna can be connected with any RF receiver, leading to N×M possible antenna/receiver connections. For each such antenna/receiver connection, there may be one or more intersecting "open" transmission lines that change the effective impedance seen by the RF receiver, thus calling for an impedance matching circuit to be switched in. There may therefore be as many as N×M impedance matching circuits, as diagrammatically indicated in FIG. 4. This is indeed the case for the illustrative example of FIGS. 2 and 3, where there are N×M=2×2=4 impedance matching stubs ST1, ST2, ST3, ST4 provided. Switching circuitry SW of FIG. 4 is diagrammatically indicated, and includes transmission lines and switches (details not shown in FIG. 4) that for each switching configuration connects each RF receiver of the N RF receivers with (1) a selected one antenna of the M available antennas and (2) an impedance matching circuit providing impedance matching of the selected one antenna with the RF receiver.

While N×M impedance matching circuits may be employed, in any given specific embodiment the number of impedance matching circuits may be less than N×M. A lower number of impedance matching circuits may be employed if, for example, not all possible antenna/RF receiver combinations are actually used.

The diagrammatic representation of FIG. 4 does not represent the actual layout of the diverse radio receiver system. To complete the design, the layout of the N RF receivers on the RF circuit board 30 and of the transmission lines and switches selectably connecting the M antenna to the N RF receivers is generated, the locations of the N×M (or fewer) impedance matching circuits are chosen, and the impedances of the impedance matching circuits are determined using Smith chart design and/or suitable RF design software. If impedance matching stubs are used as the impedance matching circuits, then the determining the impedances of the impedance matching circuits corresponds to determining lengths of the stubs that provide the impedance matching. The design process may be iterative—for example, the determined stub length may be too long to fit into the designated stub location on the RF circuit board 30, in which case the layout is revised by choosing a new stub location (which may also entail rerouting of one or more transmission lines on the RF circuit board 30), and the stub length is determined for the revised layout.

This application has described one or more preferred embodiments. Modifications and alterations may occur to others upon reading and understanding the preceding detailed description. It is intended that the application be construed as including all such modifications and alterations insofar as they come within the scope of the appended claims or the equivalents thereof.

Having thus described the preferred embodiments, the invention is now claimed to be:

1. An apparatus comprising:
   a magnetic resonance imaging system configured to transmit RF signals in an RF shielded room;
   a diverse radio receiver system including:
      a radio frequency (RF) circuit board,
      a plurality of RF receivers disposed on the RF circuit board, the RF receivers being configured to receive the RF signals transmitted by the magnetic resonance imaging system, a plurality of antennas being disposed on the RF circuit board, and switching circuitry disposed on the RF circuit board, the switching circuitry including transmission lines and switches connecting each RF receiver with (1) a selected one antenna of the plurality of antennas and (2) an impedance matching circuit providing impedance matching of the selected one antenna with the RF receiver, wherein the impedance matching circuit is disposed on the RF circuit board.

2. An apparatus comprising:

a wireless MR receive coil configured to receive an MR signal and to transmit an RF signal corresponding to the received MR signal, diverse radio receiver system is configured to receive the RF signal transmitted by the wireless MR receive coil, the diverse radio receiver system including:

a radio frequency (RF) circuit board, a plurality of RF receivers disposed on the RF circuit board, switching circuitry disposed on the RF circuit board, the switching circuitry including transmission lines and switches connecting each RF receiver with (1) a selected one antenna of a plurality of antennas and (2) an impedance matching circuit providing impedance matching of the selected one antenna with the RF receiver.

3. The apparatus of claim 2, wherein the impedance matching circuit of the switching circuitry comprise impedance matching transmission line stubs.

4. The apparatus of claim 2, wherein the impedance matching circuit of the switching circuitry comprise impedance matching transmission line stubs having shorted loads.

5. The apparatus of claim 2, wherein the diverse radio receiver system further includes said plurality of antennas with said plurality of antennas being disposed on the RF circuit board.

6. The apparatus comprising:

an RF shielded room; and a diverse radio receiver system disposed in the RF shielded room and is configured to receive an RF signal transmitted by a wireless electronic device disposed in the RF shielded room, the diverse radio receiver system including a plurality of radio frequency (RF) receivers disposed on an RF circuit board and switching circuitry including transmission lines connecting the RF receivers with antennas and switches for switching antenna/RF receiver connections to implement receiver spatial diversification, the switching circuitry further including impedance matching circuits that are switched in conjunction with the switching of antenna/RF receiver connections to maintain impedance matching of antenna/RF receiver connections.

7. The apparatus of claim 6, wherein the switching circuitry is configured to implement a plurality of selectable switch configurations, each switch configuration connecting each RF receiver of the plurality of RF receivers with a selected antenna of the plurality of antennas.

8. The apparatus of claim 7, wherein:

the plurality of RF receivers includes a first RF receiver and a second RF receiver;

the plurality of antennas includes a first antenna and a second antenna; and the plurality of selectable switch configurations include:

a first switch configuration in which (i) the first RF receiver is connected with the first antenna and with a first impedance matching circuit providing impedance matching of the first antenna with the first RF receiver and (ii) the second RF receiver is connected with the second antenna and with a second impedance matching circuit providing impedance matching of the second antenna with the second RF receiver, and a second switch configuration in which (i) the first RF receiver is connected with the second antenna and with a third impedance matching circuit providing impedance matching of the second antenna with the first RF receiver and (ii) the second RF receiver is connected with the first antenna and with a fourth impedance matching circuit providing impedance matching of the first antenna with the second RF receiver.

9. The apparatus of claim 7, wherein the diverse radio receiver system further includes:

a signal selector receiving signals from the plurality of RF receivers and outputting a signal selected from the received signals.

10. The apparatus of claim 9, wherein the diverse radio receiver system further includes:

a switch configuration selection controller causing the switching circuitry to switch from a currently selected switch configuration to a different switch configuration.

11. The apparatus of claim 6, further comprising:

a magnetic resonance (MR) scanner disposed in the RF shielded room.

12. A diverse radio receiver system comprising:

a radio frequency (RF) circuit board;

a plurality of antennas disposed on the RF circuit board;

a plurality of matching circuits disposed on the RF circuit board;

a plurality of RF receivers disposed on the RF circuit board, the RF receivers being configured to receive an RF signal transmitted in an RF shielded room by a wireless magnetic resonance receive coil;

switching circuitry disposed on the RF circuit board, the switching circuitry including transmission lines and switches configured to connect each RF receiver with (1) a selected one antenna of a plurality of antennas and with (2) a selected one of the plurality of impedance matching circuits which impedance matches the selected one antenna with the connected RF receiver, the switching circuitry being configured to implement a plurality of selectable switch configurations including:

a first switch configuration in which the switching circuitry connects a first RF receiver of the plurality of RF receivers with a first antenna of the plurality of antennas and with a first of the plurality of impedance matching circuits which impedance matches the first antenna with the first RF receiver and connects a second RF receiver of the plurality of RF receivers with a second antenna of the plurality of antennas and with a second of the plurality of impedance matching circuits which impedance matches the second antenna with the second RF receiver, and a second switch configuration in which the switching circuitry connects the first RF receiver with the second antenna and with a third impedance matching circuit which impedance matches the second antenna with the first RF receiver and connects the second RF receiver with the first antenna and with a fourth impedance matching circuit which impedance matches the first antenna with the second RF receiver;

a signal selector configured to receive signals from the plurality of RF receivers and outputting a selected one of the received signals.

13. The apparatus of claim 12, wherein the plurality of RF receivers consists of N RF receivers where N is an integer greater than one, the plurality of antennas consists of M antennas where M is an integer greater than or equal to N.

14. An apparatus comprising:
   a magnetic resonance (MR) scanner;
   a wireless MR receive coil arranged to receive an MR signal excited in a subject by the MR scanner and to transmit an RF signal corresponding to the received MR signal; and
   a diverse radio receiver system configured to receive the RF signal transmitted by the wireless MR receive coil, the diverse radio receiver system including:
      a radio frequency (RF) circuit board,
      a plurality of RF receivers disposed on the RF circuit board,
      switching circuitry disposed on the RF circuit board, the switching circuitry including transmission lines and switches connecting each RF receiver with (1) a selected one antenna of a plurality of antennas and (2) an impedance matching circuit providing impedance matching of the selected one antenna with the RF receiver, the switching circuitry being configured to implement a plurality of selectable switch configurations, each switch configuration connecting each RF receiver of the plurality of RF receivers with a selected antenna of the plurality of antennas, and
      a signal selector receiving signals from the plurality of RF receivers and outputting a selected one of the received signals.

15. The apparatus of claim 14, wherein the switching circuitry includes an impedance matching circuit for each antenna/RF receiver connection of the implemented receiver spatial diversification.

16. The apparatus of claim 14, wherein the diverse radio receiver system includes N RF receivers and M antennas, the switching circuitry implements receiver spatial diversification including N×M antennaRF receiver connections, and the switching circuitry includes N×M impedance matching circuits.

17. The apparatus of claim 14, wherein N=M=2 and the switching circuitry includes four impedance matching circuits.

\* \* \* \* \*